(12) United States Patent
Yamada

(10) Patent No.: US 6,366,025 B1
(45) Date of Patent: Apr. 2, 2002

(54) ELECTROLUMINESCENCE DISPLAY APPARATUS

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/512,733

(22) Filed: Feb. 24, 2000

(30) Foreign Application Priority Data

Feb. 26, 1999 (JP) ............................................. 11-050742
Feb. 2, 2000 (JP) ............................................. 12-024648

(51) Int. Cl.[7] ................................................ G09G 3/10
(52) U.S. Cl. ................................ 315/169.3; 315/169.1; 313/498; 313/500; 345/76; 345/77; 345/92
(58) Field of Search ........................... 315/169.3, 169.1, 315/169.4; 313/498, 500, 505, 494; 345/76, 77, 92, 36, 45

(56) References Cited

U.S. PATENT DOCUMENTS 5,550,066 A    8/1996    Tang et al. .................... 437/40
5,684,365 A    11/1997    Tang et al. .............. 315/169.3

FOREIGN PATENT DOCUMENTS

JP    8-234683    6/1996
JP    8-241047    6/1996
JP    8-241048    6/1996
JP    10039791    2/1998

*Primary Examiner*—Don Wong
*Assistant Examiner*—Tuyet T. Vo
(74) *Attorney, Agent, or Firm*—Cantor Colburn LLP

(57) ABSTRACT

A color display device having an organic EL element for each display pixel. The element emissive area in the display pixel of any color among the R, G, and B display pixels has a size that is different from the element emissive area of the display pixel of another color. Furthermore, the element emissive areas in the display pixels for R, G, and B are designed to take into consideration not only the emission efficiency of the emissive elements of the display pixels but also the luminance ratio of red to green to blue in accordance with the chromaticity of the target display white of the display device and with the chromaticity of each red, green, and blue color emitted by the emissive elements of the respective display pixels. This prevents the organic EL elements of colors for which the emission efficiency is low from selectively deteriorating, and facilitates the control of white balance in the color display.

30 Claims, 10 Drawing Sheets

|  | R | | G | | B | | W | |
|---|---|---|---|---|---|---|---|---|
|  | x | y | x | y | x | y | x | y |
| CHROMATICITY COORDINATE | 0.65 | 0.34 | 0.30 | 0.63 | 0.17 | 0.17 | 0.31 | 0.32 |
| LUMINANCE PERCENTAGE (WITH W AT 100%) | 25(%) | | 46(%) | | 29(%) | | 100(%) | |
| LUMINANCE RATIO (G) | 0.54 | | 1 | | 0.63 | | − | |

Fig. 9

ELECTROLUMINESCENCE DISPLAY APPARATUS

BACKGROUND OF THE INVENTION

1. Field of the Invention

The present invention relates to an electroluminescence display apparatus comprising an electroluminescence (hereinafter also referred to as EL) element and a thin film transistor (hereinafter referred to as TFT) element.

2. Description of the Related Art

In recent years, the EL display apparatus employing EL elements has attracted attention as being the display apparatus to replace CRTs and LCDs.

Furthermore, research and development have been conducted on display apparatuses having TFTs as the switching elements to drive the EL elements.

FIG. 1 is a top plan view showing a display pixel and periphery in an organic EL display apparatus of the related art, FIG. 2A shows a cross-sectional view along line A—A of FIG. 1, and FIG. 2B shows a cross-sectional view along line B—B of FIG. 1.

As shown in FIG. 1, a display pixel is formed in a region surrounded by gate signal lines 51 and drain signal lines 52. A first TFT 30 is provided in proximity to an intersection of both signal lines, and a source 13s of the TFT 30 serves as a capacitance electrode 55, which forms a capacitor with a holding capacitance electrode line 54 to be described later, and is connected to a gate 41 of a second TFT 40. A source 43s of the second TFT 40 is connected to an anode 61 of an organic EL element 60, and a drain 43d at the other end is connected to a power source line 53, which is a current source that is supplied to the organic EL element 60.

Furthermore, in the proximity of the TFTs, the holding capacitance electrode line 54 is positioned in parallel with the gate signal lines 51. The holding capacitance electrode line 54 is formed from a material such as chromium, and the capacitance electrode 55 is connected to the source 13s of the TFT 30. The electric charge is stored between the holding capacitance electrode line 54 and the capacitance electrode 55, via a gate insulating film 12, thus forming a capacitor. This holding capacitor is provided to hold a voltage that is applied to the gate electrode 41 of the second TFT 40.

As shown in FIGS. 2A and 2B, the organic EL display apparatus is formed by laminating in sequence the TFT and the organic EL element onto a substrate 10, such as a substrate formed from glass or synthetic resin, a conductive substrate, or a semiconductor substrate. However, when a conductive substrate or a semiconductor substrate is used for the substrate 10, an insulating film is formed, such as from $SiO_2$ or SiN, on which the TFT and organic EL display element are formed.

The first TFT 30, which is a switching TFT, will be described first.

As shown in FIG. 2A, gate signal lines 51 also serving as gate electrodes 11 and formed from a refractory metal, such as chromium or molybdenum, and the holding capacitance electrode 54 are formed on the insulating substrate 10, such as of quartz glass or no-alkali glass. Next, the gate insulating film 12 and an active layer 13, which is formed from a poly-silicon (p-Si) film, are formed in sequence.

On the entire surface of the gate insulating film 12, the active layer 13 and stopper insulating films 14, is formed an interlayer insulating film 15 in which a $SiO_2$ film, a SiN film, and a $SiO_2$ film are laminated in sequence. A drain electrode 16, which is filled with a metal, such as Al, is provided at a contact hole formed at a position corresponding to a drain 13d of the interlayer insulating film 15. Furthermore, a planarization insulating film 17, which is formed from an organic resin, is formed on the entire surface of the substrate so as to planarize the surface.

The second TFT 40, which is a TFT for driving the organic EL element, will be described next.

As shown in FIG. 2B, the gate electrodes 41, which is formed from a refractory metal, such as Cr or Mo, the gate insulating film 12, and the active layer 43 which is formed from a p-Si film, are formed in sequence on the insulating substrate 10 which is made of quartz glass or no-alkali glass. In the active layer 43 are provided channels 43c, and on both sides of the channels 43c, the source 43s and the drain 43d. On the entire surface of the gate insulating film 12 and the active layer 43 is formed the interlayer insulating film 15 in which a $SiO_2$ film, a SiN film, and a $SiO_2$ film are laminated in sequence. A power source line 53 connected to a power source (not shown) and filled with a metal, such as Al, is provided at a contact hole formed to correspond to the drain 43d. Furthermore, the planarization insulating film 17, which is formed from an organic resin or the like, is formed on the entire surface so as to planarize the surface. A contact hole is formed at a position corresponding to the source 43s of the planarization insulating film 17 and the interlayer insulating film 15, and a transparent electrode, namely, the anode 61 of the organic EL element, which is formed from ITO (indium tin oxide) and contacting the source 43s via this contact hole, is provided on the planarization insulating film 17.

The organic EL element 60, provided at each pixel so as to enable light emission at each pixel, has a structure in which are formed in sequence the anode 61 made of a transparent electrode, such as ITO, a hole transport layer 62 having a first hole transport layer formed such as from MTDATA (4,4',4"-tris(3-methylphenylphenylamino) triphenylamine) and a second hole transport layer formed such as from TPD (N,N'-diphenyl-N,N'-di(3-methylphenyl)-1,1'-biphenyl-4,4'-diamine), an emissive layer 63 formed such as from $Bebq_2$ (bis(10-hydroxybenzo[h]quinolinato) beryllium) including a Quinacridon derivative, an electron transport layer 64 formed such as from $Bebq_2$, and a cathode 66 formed from an alloy, such as magnesium-indium. The hole transport layer 62, the emissive layer 63, and the electron layer 64 form an emissive element layer 65.

In this organic EL element, holes injected from the anode and electrons injected from the cathode recombine, and organic molecules forming the emissive layer are excited and yield exitons. Light is released from the emissive layer in the process where the exitons undergo radiation deactivation, and this light is released to the outside from the transparent anode via the transparent insulating substrate.

However, the emission efficiency of the emissive layer for emitting light of various colors differs with each color.

However, in the EL display apparatus of the related art shown in FIG. 3, emissive regions 1B, 1R, and 1G for the display pixel of the respective color are arranged in a matrix configuration at every intersection of a plurality of the gate signal lines 51 and a plurality of the drain signal lines 53 and all have identical emissive areas in size. Thus, in order to obtain the same luminance at the display pixels having a low emission efficiency, a current larger than that supplied to the other display pixels having a high emission efficiency must be supplied. This causes the life of those display pixels having a low emission efficiency, in particular, to shorten, and also possibly causes the life of the EL display apparatus to shorten.

Furthermore, when the emissive areas of the display pixels of various colors, each having a different emission efficiency, are set to be identical, color balance (white balance) is difficult to achieve, and higher currents must be supplied to certain emissive layers to achieve such a balance. Thus, a drawback is that deterioration occurs at the EL elements in the display pixels supplied with the higher currents.

SUMMARY OF THE INVENTION

It is therefore an object of the present invention, which takes into consideration the above-mentioned disadvantage of the related art, to provide a display apparatus having emissive elements, such as EL elements, in which the control of white balance is simple and the service life is long.

In order to achieve the above-mentioned object, the present invention is characterized by a color display device, in which a display pixel having an emissive element is provided for every color, wherein the emissive area of the display pixel of any one color, among the display pixels of various colors, is different in size from the emissive area of the display pixel of another color.

In another aspect of the present invention in the above-mentioned color display device, the emissive area of the display pixel is set in accordance with the emission efficiency of the emissive element provided at the display pixel.

In another aspect of the present invention, the emissive area of a display pixel of the various colors is respectively set larger for lower emission efficiency of the emissive element provided at the display pixel.

In another aspect of the present invention in the above-mentioned color display device, the emissive area of a display pixel of one color is set larger than the emissive area of a display pixel of another color having emissive element with emission efficiency higher than the emissive element provided at the display pixel of the one color.

In another aspect of the present invention, the emissive area of the display pixel having the emissive element of a color with the highest emission efficiency, among emissive elements respectively emitting different colors of light for color display, is set smaller than the emissive area of the display pixel having the emissive element of another color.

In another aspect of the present invention in the above-mentioned color display device, the emissive area of a display pixel of one color is set smaller than the emissive area of a display pixel of another color having emissive element with emission efficiency lower than the emissive element provided at the display pixel of the one color.

In another aspect of the present invention in the above-mentioned color display device, the emissive area of the display pixel having the emissive element of a color with the lowest emission efficiency, among emissive elements respectively emitting different colors of light for color display, is set larger than the emissive area of the display pixel having the emissive element of another color.

In another aspect of the present invention in the above-mentioned color display device, the emissive element is an electroluminescence element having an emissive layer between a first electrode and a second electrode.

In the present invention in the color display apparatus in which each display pixel comprises an emissive element, the emissive area of the display pixel corresponds to the emissive area of the emissive element. By setting the emissive area of the display pixel, namely, the emissive area of the emissive element, in accordance with the emission efficiency of the emissive element as in the foregoing, and by supplying, for example, the same power to the emissive elements of colors having different emission efficiencies, it becomes possible to have the same emission luminance at the various display pixels. In other words, in order to obtain a target display luminance for the respective colors, it is not necessary to supply only the emissive element of a particular color, having low emission efficiency, with a power higher than the other elements. Therefore, even for an emissive element for which deterioration accelerates as the amount of the supplied power increases, it is possible to prevent the deterioration from accelerating when a load is selectively placed on the emissive element having low emission efficiency and extend the life of the display device.

In another aspect of the present invention as in one of the above-mentioned color display devices, the emissive element is an organic electroluminescence element comprising the emissive layer using an organic compound between first electrode and second electrode.

In this sort of organic EL element, in particular, when used in a color display device, where the emission efficiency differs according to the type of organic compound used as the emissive material in the emissive layer, and a different emissive material is to be used for every color, the above-mentioned problem of deterioration of the organic EL element having a low emission efficiency is liable to occur. However, this type of problem can be prevented according to the present invention.

In another aspect of the present invention, in a color display device in which a display pixel having an emissive element is provided for every color, the emissive area of the display pixel is set for every color in accordance with the emission efficiency of the emissive element provided at the display pixel, the chromaticity of each color emitted by respective emissive element, and the chromaticity of target display white of the display device.

In another aspect of the present invention, the emissive area of the display pixel of any one color, among the display pixel of various colors, is different in size from the emissive area of the display pixel of another color.

In another aspect of the present invention in a color display device having display pixel for red, for green, and for blue, respectively having emissive element, the emissive area of said display pixel for red, for green, and for blue is set on the basis of the emission efficiency of the emissive element of each display pixel, and a luminance ratio of red to green to blue in accordance with each chromaticity of red, green, and blue emitted by respective emissive element of the display pixel, and with the chromaticity of target display white of the display device.

In another aspect of the present invention in the above-mentioned color display device, the emissive area of the display pixel of any one color among the display pixel for red, for green, and for blue is different in size from the emissive area of the display pixel of another color.

In the color display device having emissive elements, the target white that is set can be represented, for example, by the addition of the lights of R, G, and B. In this sort of device, by setting the emissive area of each display pixel in accordance with the emission efficiency of the emissive element of each color R, G, and B as described above, with the chromaticity of the R, G, and B emitted by the respective emissive element, and with the chromaticity of target display white, for example, the display of a target white is simplified with the supply of the same amount of power to each emissive element of R, G, and B. In other words, the white balance is controlled by the emissive area of each emissive element so that the white balance, while these emissive elements are driven, becomes extremely easy to control. Furthermore, since the emission efficiency of the element is taken into consideration in the emissive area of each emissive element, it is possible to prevent the emissive element having low emission efficiency from deteriorating faster than the element having high emission efficiency.

In another aspect of the present invention in the above-mentioned color display device, the emissive area of the display pixel is set by smaller one of direct contact areas between an emissive element layer including the emissive layer of the organic electroluminescence element and the first electrode, and between the emissive element layer and the second electrode.

In another aspect of the present invention in the above-mentioned color display device, the emissive element is an organic electroluminescence element composed by forming in sequence a first electrode, an emissive element layer including at least an emissive layer using an organic compound, and a second electrode, the element is separated by an insulating film between layers of the first electrode and the emissive element layer in the proximity of an edge of the first electrode, and the emissive area of each display pixel in the organic electroluminescence element of the display pixel is set in accordance with the area of the insulating film covering the edge of the first electrode.

In another aspect of the present invention in the above-mentioned color display device, the insulating film, at the edge of the first electrode, is decreased thickness toward the center of the first electrode.

When the organic EL element is used as the emissive element in this manner, the organic compound is used for the emissive layer so that there is a wide selection range of materials and variation of emission colors (chromaticity and color purity), which are extremely advantageous in the color display apparatus and so forth.

On the other hand, along with the difference in emission efficiency due to the organic compound that is used in the emissive layer, the chromaticity (for example, the chromaticity of red, green, and blue) of the emitted light differs. Therefore, when the emissive area of the organic EL element is adjusted in accordance with the emission efficiency of the element as described above, a large load can be prevented from being imposed on the organic EL element having low emission efficiency. Furthermore, the emissive area of the organic EL element can be easily set by changing the electrode area or direct contact area between the emissive element layer and the first or second electrode.

Furthermore, covering the proximity of the edge of the first electrode with the insulating film as described above enables the emissive area of the organic EL element to be set to a desired area also by adjusting the contact area of the first electrode and the emissive element layer, which includes the emissive layer. In this case, when the thickness of the insulating film in the proximity of the edge of the first electrode is made thinner toward the center of the electrode, it is possible to prevent, at the emissive element layer that is formed on the first electrode and the insulating film, a disconnection from occurring at the proximity of the boundary between the first electrode and the insulating film. Furthermore, using the planarization film for the insulating film makes it possible to reliably prevent a disconnection at the second electrode that is formed on the insulating film and the emissive element layer.

In another aspect of the present invention in the above-mentioned color display device, the display pixel with the smallest emissive area is the display pixel comprising the emissive element for emitting green light, among colors red, green, and blue.

In another aspect of the present invention in the above-mentioned color display device, the display pixel with the largest emission area is the display pixel comprising the emissive element for emitting either red or blue light, among colors red, green, and blue, or the display pixel comprising the emissive element for emitting red light and the display pixel comprising the emissive element for emitting blue light.

BRIEF DESCRIPTION OF THE DRAWINGS

FIG. 9 illustrates a method for obtaining the emission luminance ratio of R, G, and B for a white display.

DETAILED DESCRIPTION OF THE PREFERRED EMBODIMENTS

An EL display apparatus of the present invention will be described below.

Figure 4:
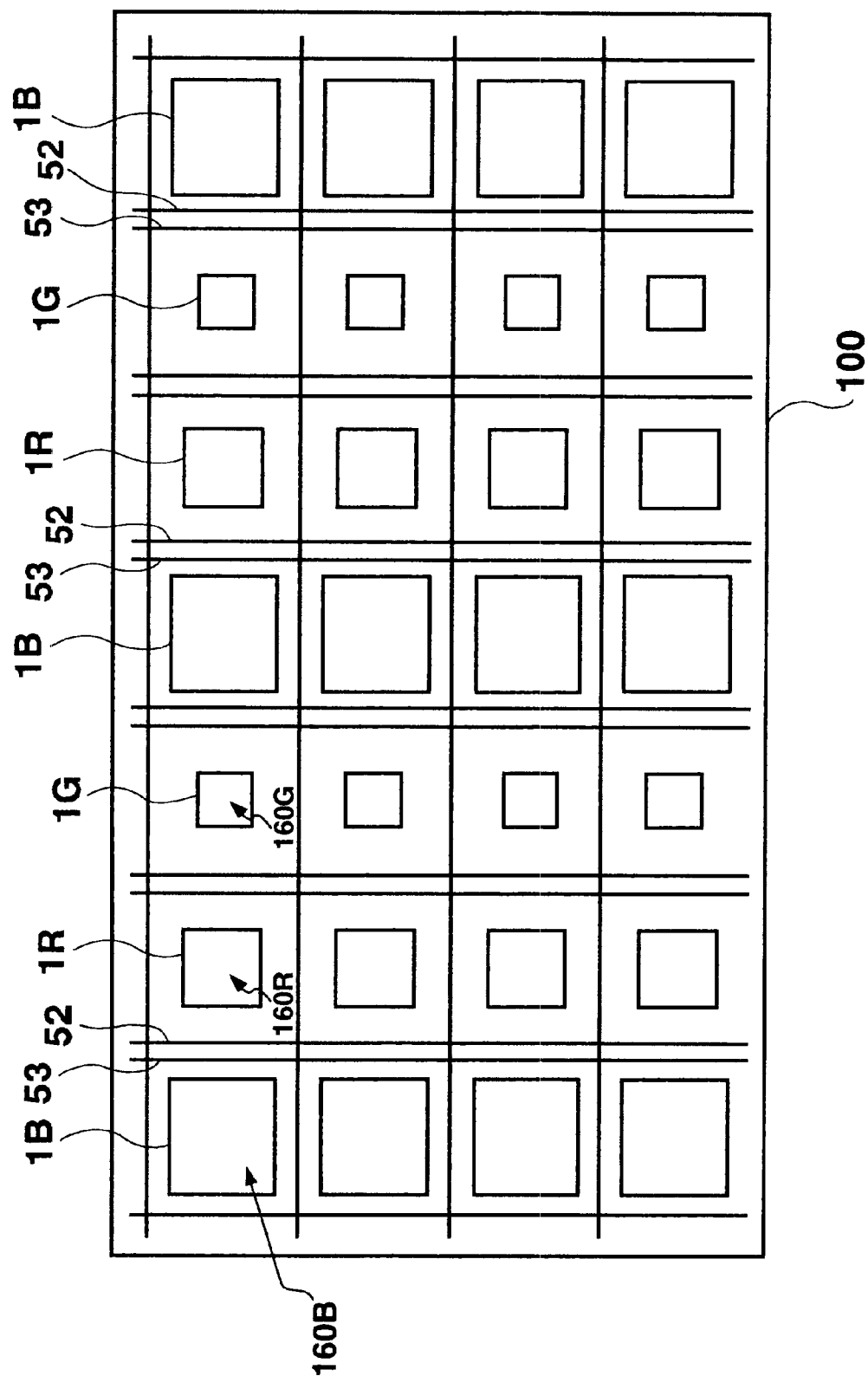
FIG. 4 is a conceptual diagram showing emissive region areas of the EL display apparatus relating to an embodiment of the present invention.

FIG. 4 is a top plan view of an EL display apparatus 100 of the present invention.

Figure 5:
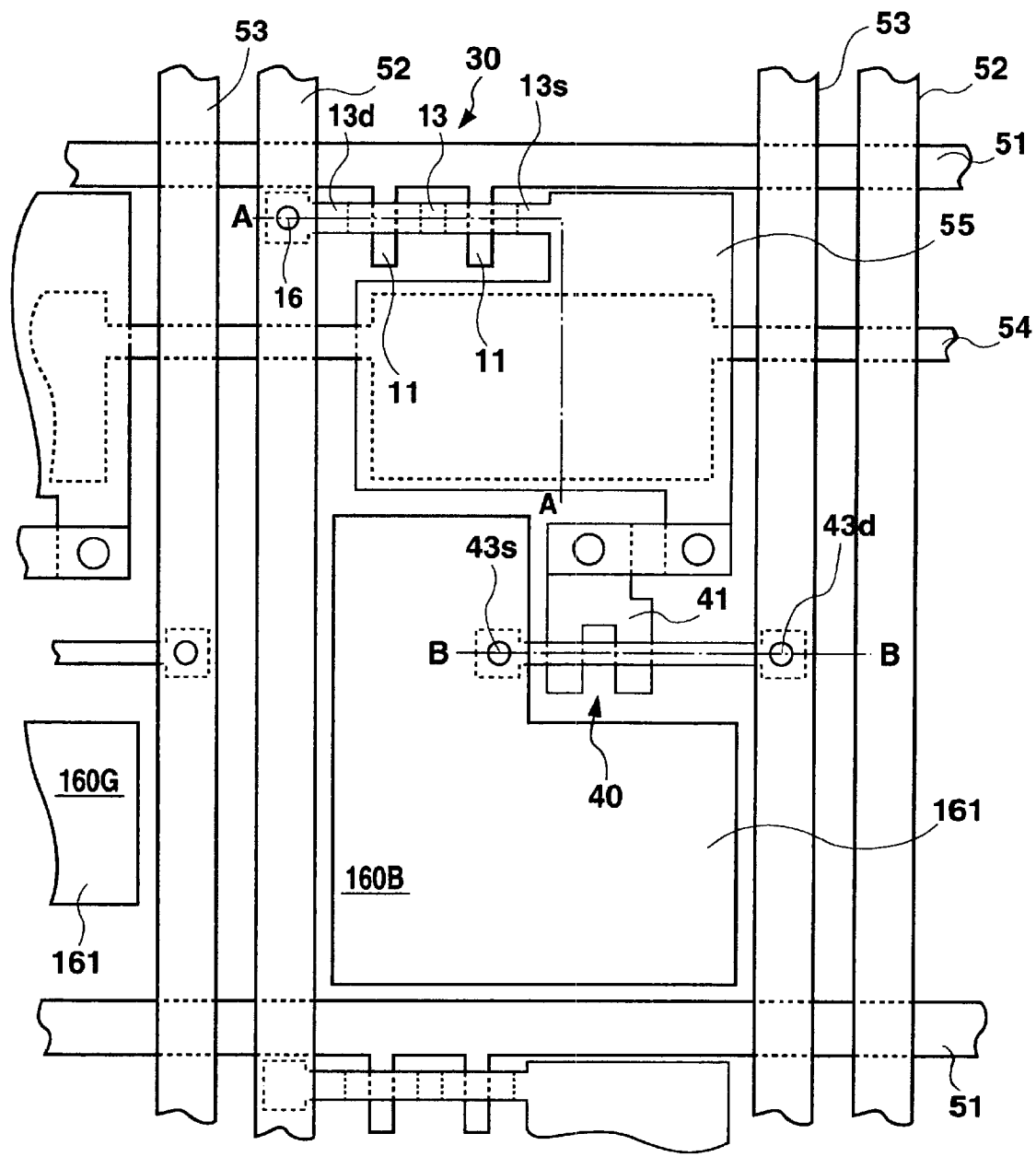
FIG. 5 is a schematic top plan view of one display pixel of the EL display apparatus relating to the embodiment of the present invention.

The same figure represents a case where the respective display pixels emit red (R), green (G), and blue (B) light. The basic cross-sectional configuration of each R, G, and B display pixel is shown in FIG. 5.

In the EL display apparatus 100, the gate signal lines 51 are arranged in the row direction, and the drain signal lines 52 and the power lines 53 supplying power to the EL elements from a power source are arranged in the column direction. The signal lines 51 intersect with the lines 52 and the lines 53.

In the proximity of their intersections are formed the first TFT 30 connected to both signal lines 51 and 52, the second TFT 40 supplying current from power line 53 to an organic EL element 160, and the organic EL element 160 emitting either a red, green, or blue light. The emissive region of FIG. 5 among the various display pixels 1 for emitting light of red, green, or blue, namely, the emissive region defined by the organic EL element 160, is conceptually shown in FIG. 4. (1R, 1B, and 1G are added in FIG. 4.)

As shown in FIG. 4, the display pixels for the various colors are arranged in a matrix configuration on the substrate. The emissive areas of the display pixels differ among 1R, 1B, and 1G. Specifically, in the case of FIG. 4, the emissive area of the green display pixel 1G is provided as the smallest. Emissive regions 1R and 1B of the other colors are formed with a larger area than that of emissive region 1G. More specifically in this case: Area of green emissive region 1G<area of red emissive region 1R<area of blue emissive region 1B.

The order in size of the areas of the green, red, and blue emission regions 1G, 1R, and 1B is dependent on the emission efficiency of the emissive materials of the organic EL element 160. Therefore, the order in size of the emission region areas is not fixed at the above-mentioned green<red<blue, but is determined by the emission efficiency of the emissive materials that are used.

Figure 1:
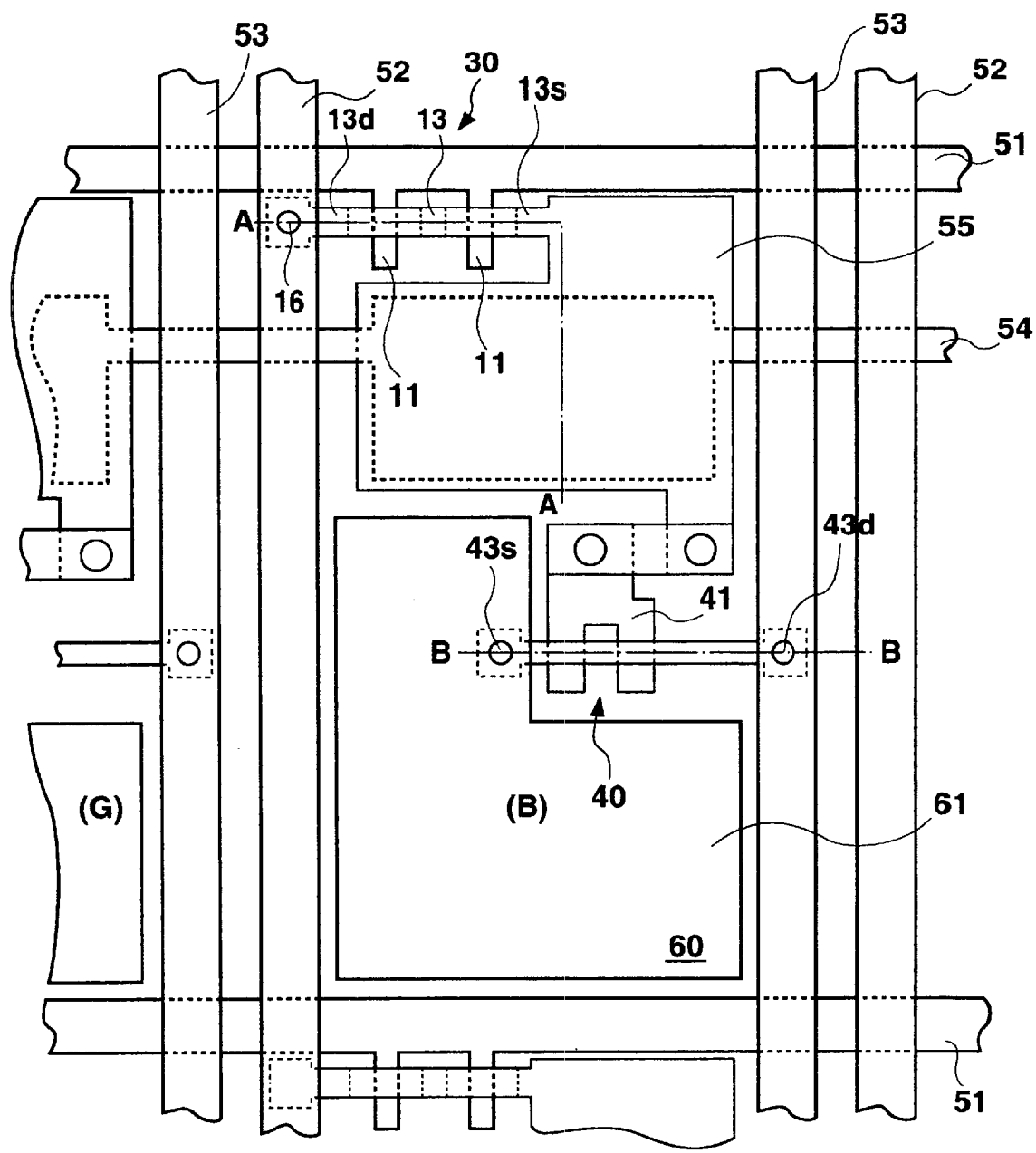
FIG. 1 is a top plan view of the EL display apparatus relating to the related art.
Figure 2A:
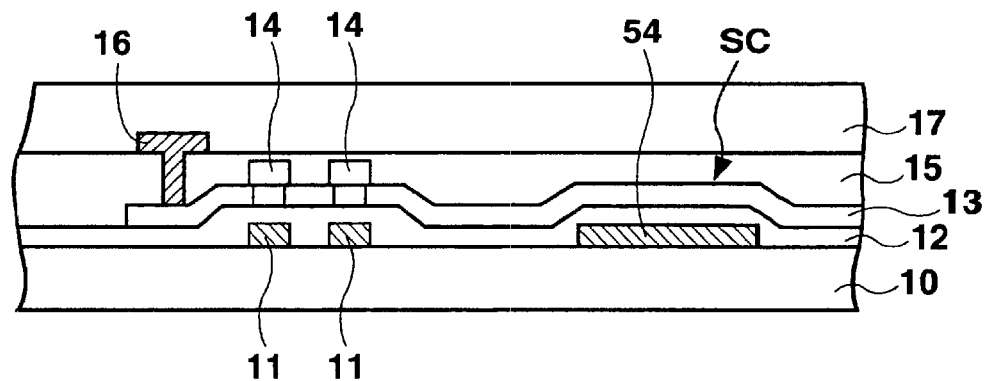
FIG. 2A is a cross-sectional view along line A—A of FIG. 1.
Figure 2B:
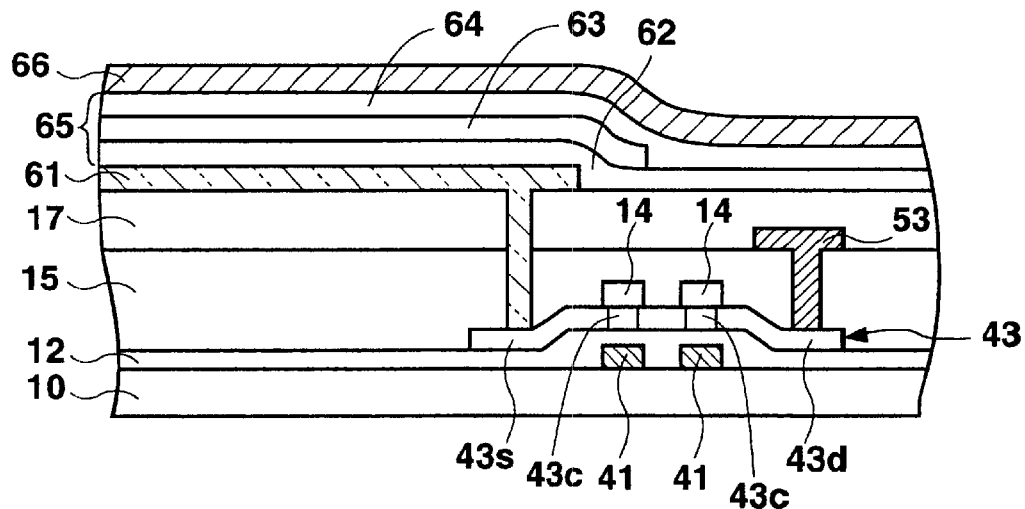
FIG. 2B is a cross-sectional view along line B—B of FIG. 1.
Figure 3:
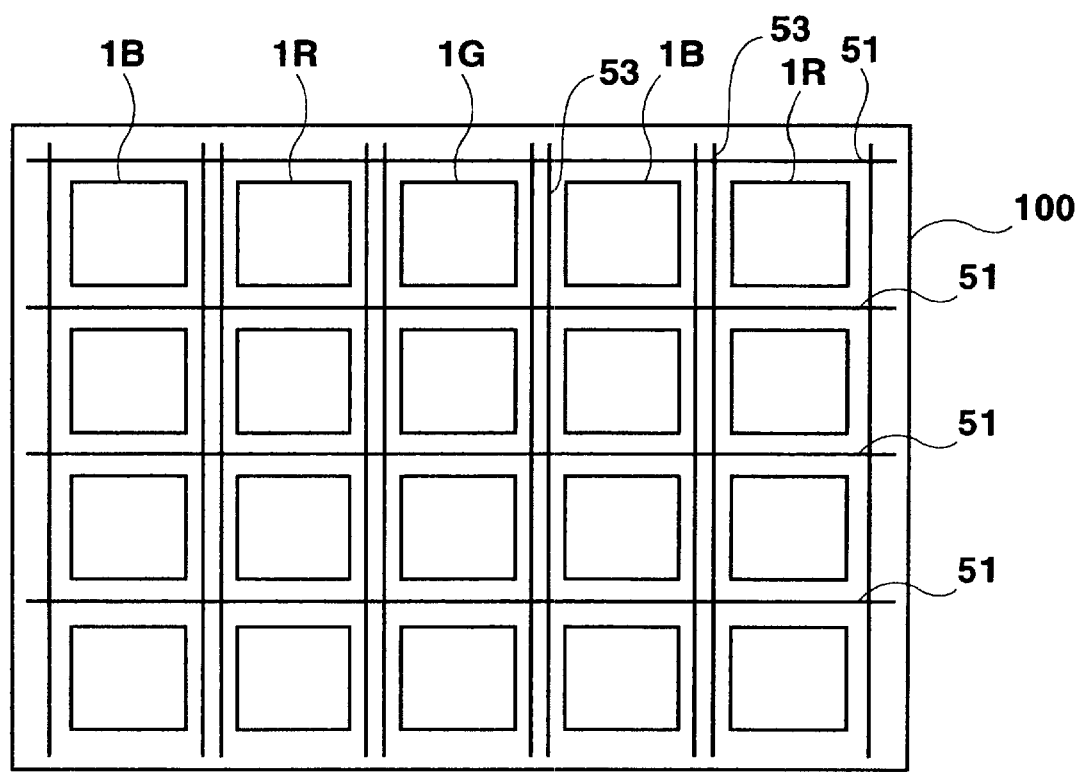
FIG. 3 is a conceptual diagram showing a layout of emissive regions of the EL display apparatus relating to the related art.
Figure 6A:
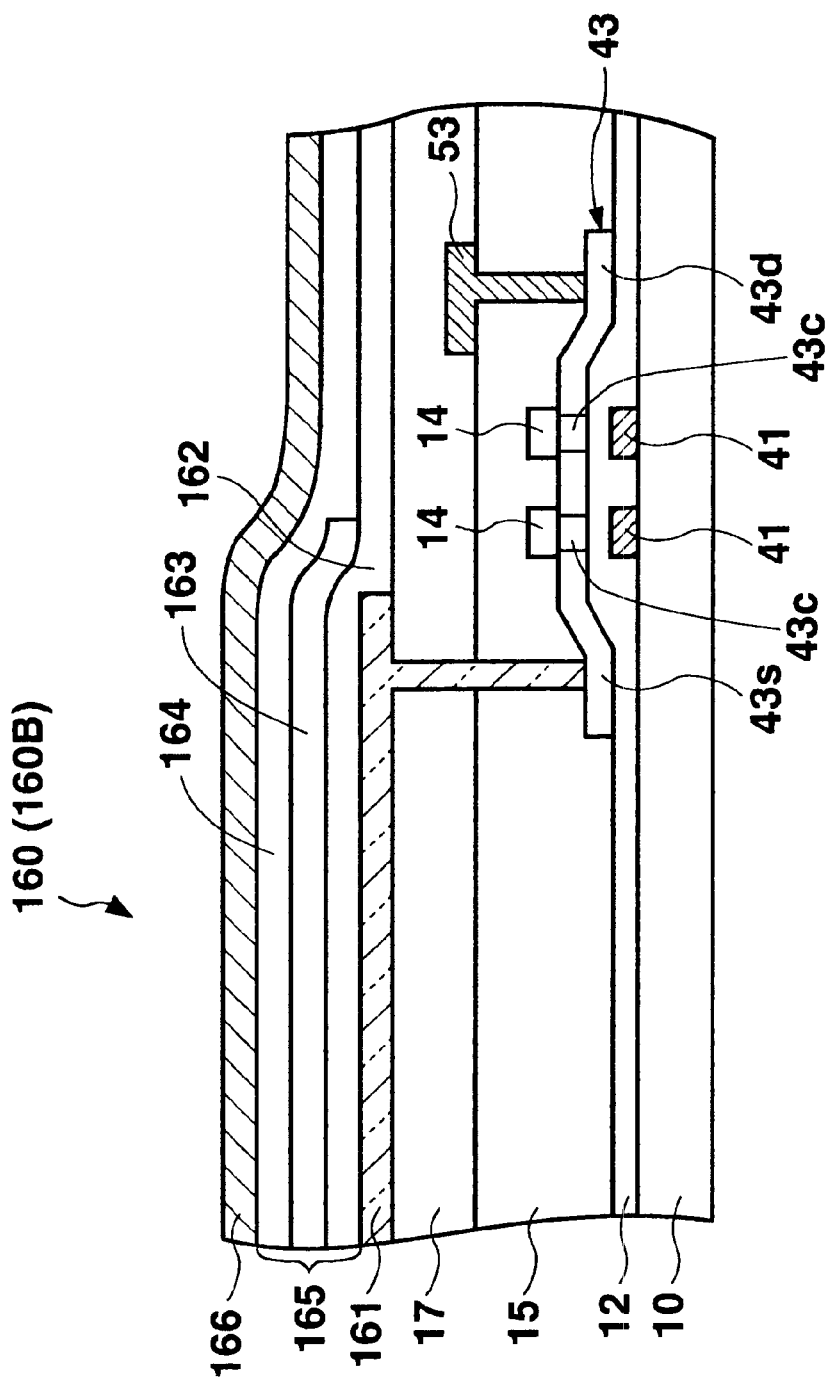
FIGS. 6A and 6B respectively show example cross-sectional configurations of one display pixel of the EL display apparatus relating to the embodiment of the present invention along line B—B of FIG. 5.
Figure 6B:
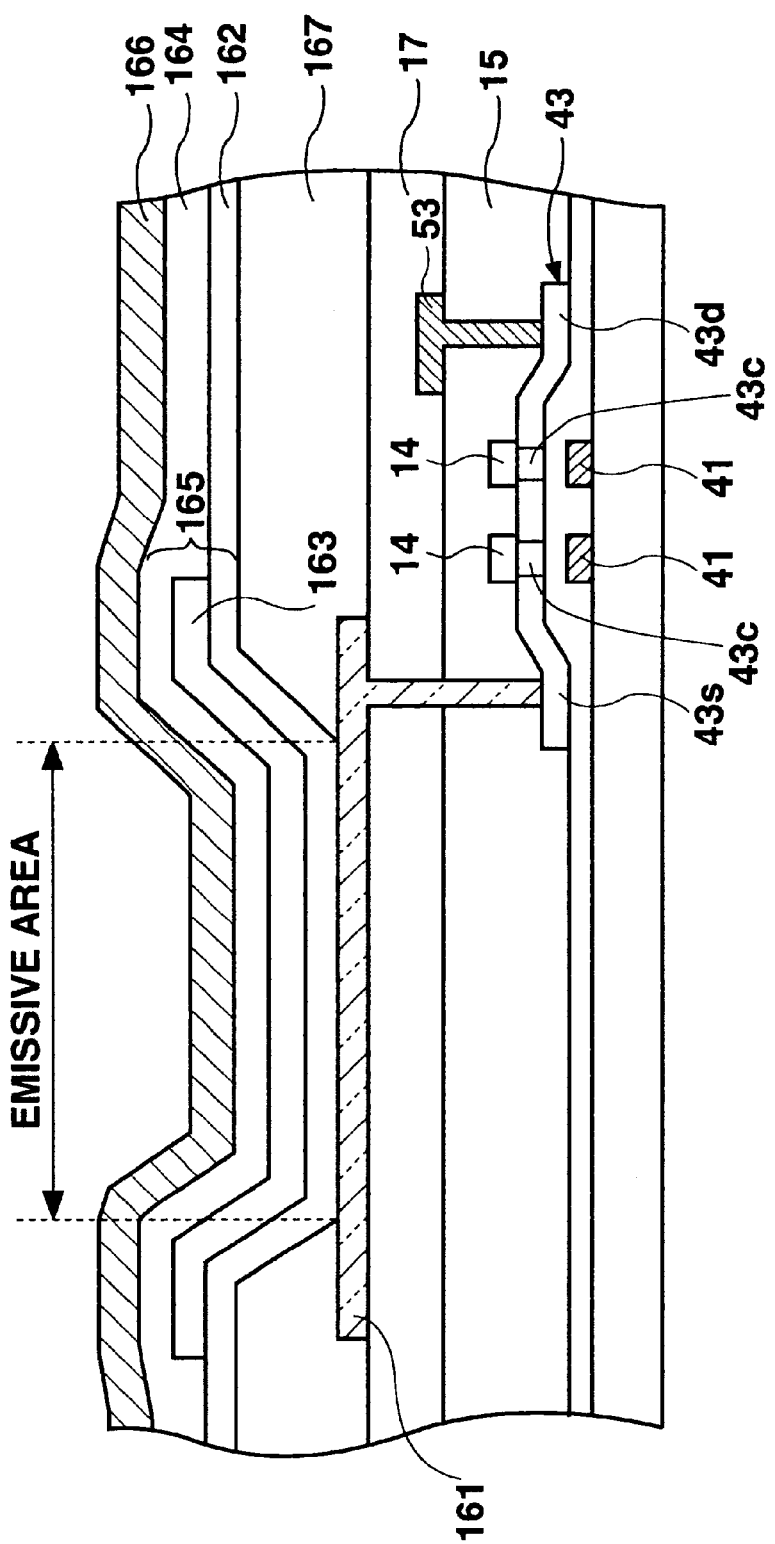

FIGS. 6A and 6B respectively show examples of a cross-sectional configuration of one display pixel of the organic EL display apparatus relating to the present embodiment along line B—B of FIG. 5. In the present embodiment, one display pixel comprises the organic EL element 160 of one of the assigned R, G, or B, the first TFT 30 for receiving a data signal in accordance with the gate signal on gate signal line 51, a holding capacitor SC for holding the data signal supplied from the data line 52 via the first TFT 30, and the second TFT 40 for supplying current via the power source line 53 to the organic EL element 160 in accordance with the held data signal. It should be noted that since the cross-sectional configurations of the first TFT 30 and the holding capacitor SC along line A—A of FIG. 5 are the same as those of the above-mentioned FIG. 2A, their descriptions will be omitted. Furthermore, the configuration of the second TFT 40 in FIGS. 6A and 6B is the same as that of the above-mentioned FIG. 2B.

The organic EL element 160 is configured by forming an anode 161 connected to the source 43s of the second TFT 40, a cathode 166 formed as a common electrode on the substrate, and an emissive element layer 165 using an organic compound between the two electrodes. The emissive element layer 165 includes at least an emissive layer, which can be formed in a single layer or multiple layers, and as an example is shown configured in the order from the anode: the hole transport layer 162, the emissive layer 163, and the electron transport layer 164.

Furthermore, in the present embodiment, in order to perform the display of colors by emitting lights of R, G, and B at the display pixels arranged in a matrix configuration on the substrate as shown in FIG. 4, different materials, in particular, different materials for organic compounds having an emissive function, are used in the organic EL elements 160 for R, for G, and for B.

As an example, the organic EL element 160R for R employs ITO for the anode 161, MTDATA (first hole transport layer) and TPD (second hole transport layer) for the hole transport layer 162, BeBq$_2$ doped at 2% with ZnPr for the emissive layer 163, and an MgIn alloy for the cathode 166.

The organic EL element 160G for G employs ITO for the anode 161, MTDATA (first hole transport layer) and TPD (second hole transport layer) for the hole transport layer 162, BeBq$_2$ for the emissive layer 163, and an MgIn alloy for the cathode 166.

The organic EL element 160B for B employs ITO for the anode 161, MTDATA (first hole transport layer) and TPD (second hole transport layer) for the hole transport layer 162, 1AZM-Hex for the emissive layer 163, and an MgIn alloy for the cathode 166. Furthermore, besides the above-mentioned materials for B, a combination of ITO (anode), MTDATA (first hole transport layer), TPD (second hole transport layer), OXD-8 (emissive layer), and MgIn (cathode) may also be used.

The above-mentioned compound abbreviations have the standard chemical names given below.

ZnPr: 5,10,15,20-tetraphenylporphyrinato zinc
MTDATA: 4,4',4"-tris(3-methylphenylphenylamino)triphenylamine
TPD: N,N'-diphenyl-N,N'-di(3-methylphenyl)-1,1'-biphenyl-4,4'-diamine
BeBq$_2$: bis(10-hydroxybenzo[h]quinolinato)beryllium
1AZM-Hex: (N,N'-disalicylidene-1,6-hexanediaminato) zinc OXD-8: 3-bis[5-(p-dimethylaminophenyl)-1,3,4-oxadiazol-2-yl]benzene When these materials are adopted as the R, G, and B organic EL elements 160 (160R, 160G, 160B), the emission efficiencies at the present result in element 160G>element 160R>element 160B. In the organic EL element 160, the emission luminance exhibits a dependency on the current (current density). Therefore, it is sufficient to set the element emissive region areas (element sizes) as described above to region 1G<region 1R<region 1B so that each color has the same luminance when the same current is supplied to each display pixel.

Described next are display pixel formation methods for forming the emissive areas in the display pixels at different optimum sizes for R, G, and B. Existing methods include (i) changing the size of the area of the anodes 161 of the organic EL elements for R, G, and B, (ii) forming the anodes 161 with areas having identical sizes, and then covering the end of anodes 161 with a planarization insulating film 167 that is formed prior to the emissive element layer so as to change the size of the contact area between the anode and the emissive element layer for R, G, and B.

Figure 7:
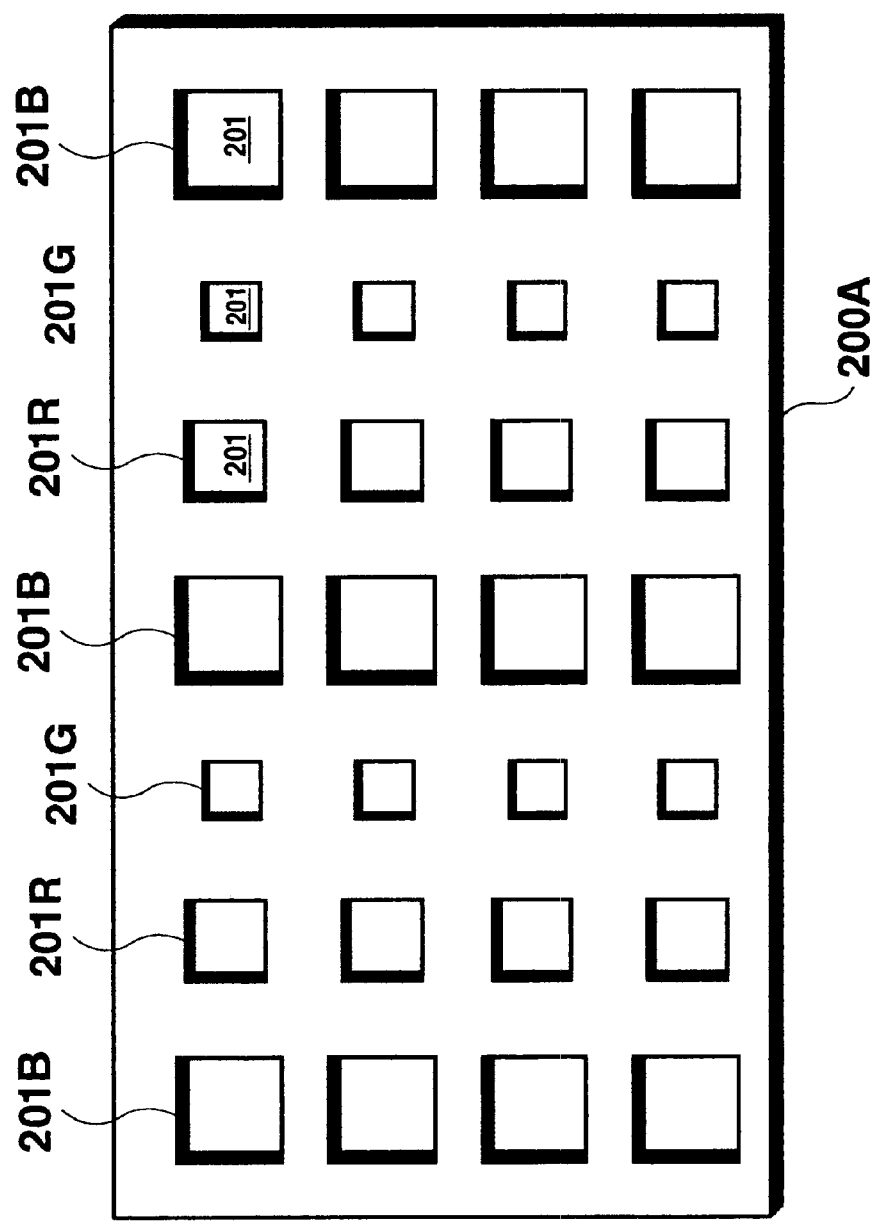
FIG. 7 shows a mask for anodes of the organic EL elements relating to the embodiment of the present invention.

The method of (i) for forming the display pixels while changing the size of the anode areas will be described first and further with reference to FIG. 7. FIG. 7 represents a mask for forming the anodes 161 of the organic EL elements 160 for R, G, and B.

A mask 200A is used so that the emissive region areas shown in FIG. 4 realize 1G<1R<1B, and openings 201 are formed in accordance with the size of the intended anode. The largest openings shown are the openings 201B for the anodes of the blue EL elements, which have the lowest emission efficiency among the R, G, and B EL elements, and the smallest openings are the openings 201G for the anodes of the green EL elements, which have the highest emission efficiency. The openings having a size between the sizes of openings 201B and 201G are openings 201R for the anodes of the red EL elements, which have an emission efficiency lower than that of the green EL elements and higher than that of the blue EL elements.

The method of (i) will be described hereinafter in detail with reference to FIG. 6A. The process up until forming the second TFT 40, forming the interlayer insulating film 15 to cover the TFT 40, the power line 53 connected to the drain 43d of the TFT 40, and the planarization insulating film 17 to cover the entire surface of the substrate, forming a contact hole in the region corresponding to the source 43s of the TFT 40 so as to penetrate the planarization insulating film 17 and the interlayer insulating film 15, and forming ITO into a transparent electrode (anode) through sputtering so as to cover the contact hole and the entire surface of the planarization insulating film 17, is the same as for the configuration shown in FIG. 2B described above.

In the present embodiment, after ITO is formed, resist is applied, and using the mask 200A shown in the above-mentioned FIG. 7, exposure and development are performed. The resist pattern then remains only at the positions corresponding to the openings 201R, 201G, and 201B, and using this resist pattern as an etching mask, the ITO is etched with a predetermined etchant. This causes ITO patterns to be formed at the positions and sizes corresponding to the openings 201R, 201G, and 201B of the mask 200A, resulting in different sizes of the anodes 161 for R, G, and B.

After the anodes 161 of the organic EL elements are formed at the respective display pixel regions, the above-mentioned organic compound materials, which differ for R, G, and B, are used next to form the emissive element layer 165 for R, G, and B. For the organic EL elements, the materials used in the emissive element layer have a relatively high resistance and the emissive region is limited to the region that is sandwiched between the anode and cathode layers in the emissive element layer. Therefore, the emissive element layer may be the same as the anode formation region or larger than the anode formation region. However, to prevent a short circuit at the anode end between the anode and cathode formed on the emissive element layer, the emissive element layer for R, G, and B in the present embodiment shown in FIG. 6A are set to be larger than the respective anode area so as to cover the anode. Of course, if another countermeasure is adopted so that a short circuit does not occur between the anode and cathode (for example, forming the planarization insulating film 167 as shown in FIG. 6B to be described later), it is not absolutely necessary for the emissive element layer 165 to be larger than the anode.

If a configuration is employed as described above where the organic EL element for R is ITO, MTDATA, TPD, BeBq$_2$+ZnPr2%, and MgIn, the organic EL element for G is ITO, MTDATA, TPD, BeBq$_2$, and MgIn, and the organic EL element for B is either ITO, MTDATA, TPD, 1AZM-Hex, and MgIn or ITO, MTDATA, TPD, OXD-8, and MgIn, the same materials are used for R, G, and B in the hold transport layers 162, which are composed from the first and second hole transport layers, and when forming the hole transport layers 162, the hole transport layers 162 are formed on the corresponding anodes 161 and the entire surface of the planarization insulating film 17 regardless of distinction of R, G, and B as shown in FIG. 6A.

Figure 8:
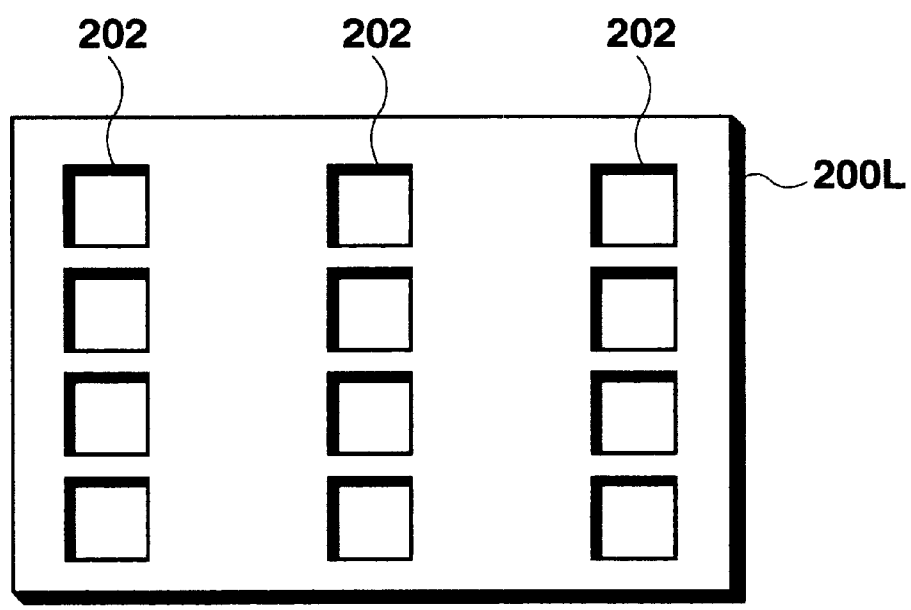
FIG. 8 shows a mask for emissive layers of the organic EL elements relating to the embodiment of the present invention.

Regarding the formation of the emissive layers 163, in the present embodiment as described above, different emissive materials are used for R, G, and B so that the emissive layers 163 for the various colors are formed in sequence by changing the material. A mask 200L, as shown in FIG. 8, is used in the formation of the emissive layers 163 for the various colors. The mask 200L employs a metal, such as tungsten (W), or a material, such as silicon.

As shown in the same figure, the mask 200L has openings 202 for forming the emissive layers on the substrate of the same color, and the openings 202 are provided so as to overlap with the anodes of the various colors formed using the mask 200A shown in FIG. 7 by shifting the position of the mask 200L. At this time, the area of the emissive layers may be the same as the anodes, or larger than the anodes so as to cover the anodes, and in the present embodiment, as shown in FIG. 6A, is set to be larger than any of the anodes for R, G, and B.

For example, in the process of sputtering the emissive layers for emitting blue light, the mask 200L is aligned prior to sputtering so that the openings 202 of the mask 200L are positioned at the regions where the emissive layers for blue light are to be formed and in contact over the hole transport layers 162. Thereafter, the island-shaped blue emissive layers are formed corresponding to the openings 202 by sputtering the blue emissive material.

For the sputtering of the red emissive layers, the mask 200L is shifted horizontally so that the openings 202 in the mask 200L are positioned on the regions where the red emissive layers are to be formed. In the same manner, for the sputtering of the green emissive layers, the openings in the mask 200L are positioned on the regions where the green emissive layers are to be formed. This procedure sequentially forms island-shaped emissive layers having the same area size on the hole transport layers 162 with different materials for R, G, and B. This enables the emissive layers 163 to be formed for the various colors.

After formation of the emissive layers 163, for the EL element 160 requiring the electron transport layers 164, an electron transport material is sputtered on the emissive layers 163 and the hole transport layers 162 to form the electron transport layers 164.

The cathodes 166 are formed from the accumulation of a magnesium indium alloy or the like through sputtering so as to cover the emissive element layer obtained from the above-mentioned process. Thus, this yields a display apparatus employing organic EL elements having anodes of different area sizes for R, G, and B and having element emissive areas of the desired sizes for R, G, and B.

The method of (ii) for forming anodes of identical area sizes and forming different sizes of the contact areas between anodes and emissive element layers with the planarization insulating film formed between the anodes and emissive layers will be described next.

As shown in FIG. 6B, to prevent the emissive element layer 165 provided on the anode 161 from disconnecting due to the step of the anode 161, it is preferable for the planarization insulating film 167 to cover the peripheral part of the anode 161. In the case of an EL element having this configuration, the region actually emitting light, namely, the emissive area, is in contact with the emissive element layer 165 and the anode 161, and the peripheral part of the anode 161 covered by the planarization insulating film 167 is actually an area not emitting light.

Therefore, by varying for each color only the area of the peripheral part of the anode 161 covered by the planarization insulating film 167, the emissive area of the display pixel of each color can be varied.

Varying the emissive area of the display pixel of each color in this manner serves to extend the life of the EL elements.

In the above-mentioned embodiment, when the emission efficiency is green>red>blue, an example was described where the emissive area of the display pixels was green<red<blue so that the size of the emissive area for the various colors differed in this order. However, an embodiment need not be limited to this example. For example, with the emission efficiency at the same green>red>blue, the emissive areas may be set to green=red<blue or to green<red=blue.

In the organic EL element, which exhibits a tendency toward accelerated deterioration at higher currents as described in the foregoing, when the lights of the various colors are emitted at the same luminance by supplying a larger current to the EL element emissive layers of the display pixels having a low emission efficiency than to the emissive layers for the other color, it is possible to prevent a shortcoming in which the elements having a low emission efficiency selectively deteriorate. As a result, the life for the overall display apparatus can be extended.

The following is given as an example of an area ratio. For example, when the supply currents are identical in the case where the luminance ratio of the green, red, and blue lights that are emitted is 1:1:1, the emission efficiency ratio becomes 10:3.8:1.8. The ratio of emissive areas of the colors required to achieve a luminance of "1" among all the colors is set to 1/10:1/3.8:1/1.8=1:2.6:5.6.

Setting the emissive area ratio in this manner enables the R, G, and B lights to be emitted at the same luminance without a large current being supplied only to the blue EL elements, which have the lowest emission efficiency, thus enabling the life of the emissive layers to be extended.

Another example of the area ratio will be described next. This example takes into consideration the prevention of deterioration of the organic EL elements of a color for which the emission efficiency is low and the control of white balance in a full-color display.

When a color display is performed using the self-emissive organic EL elements for display pixels, white is displayed by adding the emitted light from the organic EL elements of the colors R, G, and B.

When the target white is expressed as chromaticity coordinates (x,y: 0.31, 0, 32) of a reference white light source (C light source) of the NTSC format, and when the chromaticity of the R, G, and B colors of light emitted by the respective organic EL elements is expressed by the coordinates shown at the top of FIG. 9, the luminance required for R, G, and B to achieve a white luminance of 100% is set, for example, at 25%:46%:29%. Expressed as a luminance ratio, this becomes R:G:B=0.54:1:0.63.

Furthermore, when the emission efficiency ratio of the various colors of the organic EL elements is 10:3.8:1.8 for green, red, and blue as described above, the emissive area ratio becomes G:R:B=1/10:0.54/3.8:0.63/1.8=1:14.2:35 to achieve a G, R, and B luminance ratio of G:R:B= 1:0.54:0.63.

In this manner, when the chromaticity of R, G, and B and the chromaticity of the target white, as well as the emission efficiency of the various colors are taken into consideration and the emissive layers for R, G, and B are set, for example, so that the area ratio of the emissive regions assumes the above-mentioned values, a white luminance of 100% can be achieved with the same amount of current supplied to the organic EL elements of the various display pixels.

Therefore, in an EL display apparatus in which the area ratio has been determined by this method, the luminance balance of the various colors is adjusted by the emissive areas so that control of the white balance is extremely simple and the need for supplying large currents only to the EL elements of a particular color is obviated, thereby enabling the service life of the overall display apparatus to be extended.

If the materials to be used are different, the chromaticity coordinate values of the R, G, and B lights emitted from the organic EL elements are also different. The luminance ratio of R to G to B also changes accordingly, and the emission efficiency values also change. The emissive area ratio is determined accordingly and is therefore not limited to the values given above.

Furthermore, in the present invention, when the same current is respectively supplied to the R, G, and B organic EL elements, the configuration is not limited to having the emissive areas of the elements set so that 100% white is always achieved. For example, taking into further consideration the characteristics of the driver circuit (not shown) for driving the display pixels, the emissive areas of the R, G, and B organic EL elements can be set so as to simplify the control of the white balance for the overall apparatus and to prevent selective loading on the elements with a low emission efficiency.

Furthermore, in the above-mentioned embodiment, although the organic EL display apparatus was described as an example, the present invention is not limited to organic EL display apparatuses. Instead using the organic EL elements as the emissive elements, an inorganic EL display apparatus using inorganic EL elements or a vacuum fluorescent display (VFD) comprising a fluorescent layer as the emissive layer between two electrodes yields a similar effect as the organic EL display apparatus.

The emissive area of a display pixel in the present invention refers to the area of the region at which the emissive element of the display pixel actually emits light.

Namely, as shown in FIG. 6B, when the planarization insulating film, provided to prevent the emissive layer from creating a step and short circuiting with the cathode caused by the step from the thickness of the anode, covers the periphery of the anode, the anode and emissive element layer are in direct contact and form the area of the region actually emitting light.

Furthermore, although an example was given for the present embodiment in which the display pixels were arranged in 4 rows by 7 columns, the present invention is not limited to such a size and is applicable to an arbitrary number of display pixels, such as VGA (640×480), SVGA (800×600), XGA (1024×768), and SXGA (1280×1024).

Furthermore, although the display pixels assumed the form of a square in the example (FIG. 4), the present invention is not limited to such a form, and is applicable to a rectangular shape or an "L" shape, or any shape that does not hinder the emission of light from the emissive layer.

Furthermore, although the arrangement of the display pixels of various colors in the embodiment was shown in a stripe layout, the same effect is also obtained in a delta layout and a diagonal layout. Still furthermore, although the TFTs were shown in a so-called bottom gate configuration, the present invention is also applicable to TFTs in a so-called top gate configuration.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A color display device, in which a display pixel having an emissive element is disposed for every color, wherein an emissive area of the display pixel of any one color, among the display pixels of various colors, is different in size from the emissive area of the display pixel of another color, said emissive element is an organic electroluminescence element comprising an emissive layer using an organic compound between a first electrode and a second electrode, and the emissive area of said display pixel is set by smaller one of direct contact areas between an emissive element layer including said emissive layer of said organic electroluminescence element and said first electrode, and between said emissive element layer and said second electrode.

2. A color display device according to claim 1 wherein the emissive area of said display pixel is set in accordance with the emission efficiency of said emissive element disposed at said display pixel.

3. A color display device according to claim 2 wherein the emissive area of the display pixel of said various colors is respectively set larger for lower emission efficiency of said emissive element disposed at said display pixel.

4. A color display device according to claim 1 wherein the emissive area of the display pixel of one color is set larger than the emissive area of the display pixel of another color having the emissive element with emission efficiency higher than the emissive element disposed at the display pixel of said one color.

5. A color display device according to claim 1 wherein the emissive area of the display pixel having the emissive element of a color with the highest emission efficiency, among emissive elements respectively emitting different colors of light for color display, is set smaller than the emissive area of the display pixel having the emissive element of another color.

6. A color display device according to claim 1 wherein the emissive area of the display pixel of one color is set smaller than the emissive area of the display pixel of another color having the emissive element with emission efficiency lower than the emissive element disposed at the display pixel of said one color.

7. A color display device according to claim 1 wherein the emissive area of the display pixel having the emissive element of a color with the lowest emission efficiency, among emissive elements respectively emitting different colors of light for color display, is set larger than the emissive area of the display pixel having the emissive element of another color.

8. A color display device according to claim 1 wherein the display pixel with the smallest emissive area is the display pixel comprising the emissive element for emitting green light, among colors red, green, and blue.

9. A color display device according to claim 1 wherein the display pixel with the largest emissive area is:
   the display pixel comprising the emissive element for emitting either red or blue light, among colors red, green, and blue; or
   the display pixel comprising the emissive element for emitting red light and the display pixel comprising the emissive element for emitting blue light.

10. A color display device according to claim 1 wherein said emissive element is an electroluminescence element having an emissive layer between a first electrode and a second electrode.

11. A color display device, in which a display pixel having an emissive element is disposed for every color, wherein an emissive area of the display pixel of any one color, among the display pixels of various colors, is different in size from the emissive area of the display pixel of another color, and wherein said emissive element is an organic electroluminescence element composed by forming in sequence a first electrode, an emissive element layer including at least an emissive layer using an organic compound, and a second electrode;
   the emissive element is separated by an insulating film between layers of said first electrode and said emissive element layer in the proximity of an edge of said first electrode; and
   the emissive area of each display pixel in the organic electroluminescence element of the display pixel is set in accordance with an area of said insulating film covering the edge of said first electrode.

12. A color display device according to claim 11 wherein said insulating film, in the proximity of the edge of said first electrode, is decreased thickness toward the center of said first electrode.

13. A color display device according to claim 11 wherein the emissive area of the display pixel of one color is set larger than the emissive area of the display pixel of another color having the emissive element with emission efficiency higher than the emissive element disposed at the display pixel of said one color.

14. A color display device according to claim 11 wherein the emissive area of the display pixel having the emissive element of a color with the highest emission efficiency, among emissive elements respectively emitting different colors of light for color display, is set smaller than the emissive area of the display pixel having the emissive element of another color.

15. A color display device according to claim 11 wherein the emissive area of the display pixel of one color is set smaller than the emissive area of the display pixel of another color having the emissive element with emission efficiency lower than the emissive element disposed at the display pixel of said one color.

16. A color display device according to claim 11 wherein the emissive area of the display pixel having the emissive element of a color with the lowest emission efficiency, among emissive elements respectively emitting different colors of light for color display, is set larger than the emissive area of the display pixel having the emissive element of another color.

17. A color display device according to claim 11 wherein the display pixel with the smallest emissive area is the display pixel comprising the emissive element for emitting green light, among colors red, green, and blue.

18. A color display device according to claim 11 wherein the display pixel with the largest emissive area is:
   the display pixel comprising the emissive element for emitting either red or blue light, among colors red, green, and blue; or
   the display pixel comprising the emissive element for emitting red light and the display pixel comprising the emissive element for emitting blue light.

19. A color display device according to claim 11 wherein the emissive area of said display pixel is set in accordance with the emission efficiency of said emissive element disposed at said display pixel.

20. A color display device according to claim 19 wherein the emissive area of the display pixel of said various colors is respectively set larger for lower emission efficiency of said emissive element disposed at said display pixel.

21. A color display device, in which a display pixel having an emissive element is disposed for every color, wherein an emissive area of said display pixel is set for every color in accordance with:
   the emission efficiency of said emissive element disposed at said display pixel;
   the chromaticity of each color emitted by respective emissive element; and
   the chromaticity of a target display white of the display device, and wherein
   said emissive element is an organic electroluminescence element comprising an emissive layer using an organic compound between a first electrode and a second electrode, and the emissive area of said display pixel is set by smaller one of direct contact areas between an emissive element layer including said emissive layer of said organic electroluminescence element and said first electrode, and between said emissive element layer and said second electrode.

22. A color display device according to claim 21 wherein the emissive area of the display pixel of any one color, among the display pixel of various colors, is different in size from the emissive area of the display pixel of another color.

23. A color display device, in which a display pixel having an emissive element is disposed for every color, wherein an emissive area of said display pixel is set for every color in accordance with:

the emission efficiency of said emissive element disposed at said display pixel;

the chromaticity of each color emitted by respective emissive element; and the chromaticity of a target display white of the display device, and wherein:

said emissive element is an organic electroluminescence element composed by forming in sequence a first electrode, an emissive element layer including at least an emissive layer using an organic compound, and a second electrode;

the emissive element is separated by an insulating film between layers of said first electrode and said emissive element layer in the proximity of an edge of said first electrode; and the emissive area of each display pixel in the organic electroluminescence element of the display pixel is set in accordance with an area of said insulating film covering the edge of said first electrode.

24. A color display device according to claim 23 wherein said insulating film, in the proximity of the edge of said first electrode, is decreased thickness toward the center of said first electrode.

25. A color display device according to claim 23 wherein the emissive area of the display pixel of any one color, among the display pixel of various colors, is different in size from the emissive area of the display pixel of another color.

26. A color display device having display pixels for red, for green, and for blue, respectively having an emissive element, wherein an emissive area of said display pixels for red, for green, and for blue is set on the basis of:

the emission efficiency of the emissive element of each display pixel; and a luminance ratio of red to green to blue in accordance With each chromaticity of red, green, and blue emitted by respective emissive element of the display pixel, and with the chromaticity of a target display white of the display device, and wherein said emissive element is an organic electroluminescence element comprising an emissive layer using an organic compound between a first electrode and a second electrode, and the emissive area of said display pixel is set by smaller one of direct contact areas between an emissive element layer including said emissive layer of said organic electroluminescence element and said first electrode, and between said emissive element layer and said second electrode.

27. A color display device according to claim 26 wherein the emissive area of the display pixel of any one color among said display pixel for red, for green, and for blue is different in size from the emissive area of the display pixel of another color.

28. A color display device having display pixels for red, for green, and for blue, respectively having an emissive element, wherein an emissive area of said display pixels for red, for green, and for blue is set on the basis of:

the emission efficiency of the emissive element of each display pixel; and a luminance ratio of red to green to blue in accordance with each chromaticity of red, green, and blue emitted by respective emissive element of the display pixel, and with the chromaticity of a target display white of the display device, and wherein:

said emissive element is an organic electroluminescence element composed by forming in sequence a first electrode, an emissive element layer including at least an emissive layer using an organic compound, and a second electrode;

the emissive element is separated by an insulating film between layers of said first electrode and said emissive element layer in the proximity of an edge of said first electrode; and the emissive area of each display pixel in the organic electroluminescence element of the display pixel is set in accordance with an area of said insulating film covering the edge of said first electrode.

29. A color display device according to claim 28 wherein said insulating film, in the proximity of the edge of said first electrode, is decreased thickness toward the center of said first electrode.

30. A color display device according to claim 28 wherein the emissive area of the display pixel of any one color among said display pixel for red, for green, and for blue is different in size from the emissive area of the display pixel of another color.

* * * * *